(12) United States Patent
Narendar et al.

(10) Patent No.: US 8,017,062 B2
(45) Date of Patent: Sep. 13, 2011

(54) SEMICONDUCTOR PROCESSING COMPONENTS AND SEMICONDUCTOR PROCESSING UTILIZING SAME

(76) Inventors: Yeshwanth Narendar, Westford, MA (US); Matthew A. Simpson, Sudbury, MA (US); Richard R. Hengst, Oakham, MA (US)

( * ) Notice: Subject to any disclaimer, the term of this patent is extended or adjusted under 35 U.S.C. 154(b) by 0 days.

(21) Appl. No.: 11/210,247

(22) Filed: Aug. 23, 2005

(65) Prior Publication Data
US 2006/0046450 A1    Mar. 2, 2006

Related U.S. Application Data

(60) Provisional application No. 60/603,984, filed on Aug. 24, 2004, provisional application No. 60/603,985, filed on Aug. 24, 2004.

(51) Int. Cl.
*B29C 47/54* (2006.01)

(52) U.S. Cl. ........ 264/500; 264/109; 428/408; 428/446; 428/698; 428/701

(58) Field of Classification Search .................. 438/408; 204/298.06; 216/67; 501/88; 34/406; 432/258; 257/348; 428/408, 416, 578, 446, 698, 701; 264/500, 109
See application file for complete search history.

(56) References Cited

U.S. PATENT DOCUMENTS

| | | | |
|---|---|---|---|
| 4,490,209 A | 12/1984 | Hartman | |
| 5,422,322 A | 6/1995 | Chen et al. | |
| 5,560,993 A * | 10/1996 | Morimoto et al. | 428/408 |
| 5,597,882 A * | 1/1997 | Schiller et al. | 528/18 |
| 5,798,016 A | 8/1998 | Oehrlein et al. | |
| 6,099,302 A * | 8/2000 | Hong et al. | 432/259 |
| 6,147,006 A | 11/2000 | Mouri et al. | |
| 6,245,202 B1 * | 6/2001 | Edamura et al. | 204/298.06 |
| 6,379,789 B1 | 4/2002 | Crowley et al. | |
| 6,488,497 B1 * | 12/2002 | Buckley et al. | 432/258 |
| 6,699,401 B1 * | 3/2004 | Horiuchi et al. | 216/108 |
| 6,844,242 B2 * | 1/2005 | Naruoka et al. | 438/455 |
| 6,925,731 B2 * | 8/2005 | Nishimura et al. | 34/406 |
| 7,199,021 B2 * | 4/2007 | Quevedo-Lopez et al. | 438/425 |
| 7,625,807 B2 * | 12/2009 | Quevedo-Lopez et al. | 438/425 |
| 2001/0003271 A1 | 6/2001 | Otsuki | |
| 2002/0018921 A1 | 2/2002 | Yamada et al. | |
| 2003/0029563 A1 | 2/2003 | Kaushal et al. | |
| 2004/0002221 A1 | 1/2004 | O'Donnell et al. | |
| 2004/0009649 A1 * | 1/2004 | Kub et al. | 438/459 |

(Continued)

FOREIGN PATENT DOCUMENTS

EP    0 308 695 A2    3/1989

(Continued)

OTHER PUBLICATIONS

J.W. Nowok, J.P. Kay, R.J. Kulas, Thermal expansion and high-temperature phase transformation of the yttrium silicate Y2SiO5, Aug. 2001, Journal of Materials Research Society, vol. 16, No. 8.*

(Continued)

*Primary Examiner* — Zandra Smith
*Assistant Examiner* — Tsz Chiu
(74) *Attorney, Agent, or Firm* — David Fonda

(57) ABSTRACT

A semiconductor processing component includes a substrate and a layer overlying the substrate. The layer has a composition $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$.

17 Claims, 4 Drawing Sheets

U.S. PATENT DOCUMENTS

| | | | |
|---|---|---|---|
| 2004/0115958 A1* | 6/2004 | Cho | 438/795 |
| 2004/0173948 A1* | 9/2004 | Pandelisev | 264/500 |
| 2005/0145584 A1* | 7/2005 | Buckley et al. | 211/41.18 |
| 2005/0148455 A1* | 7/2005 | Narendar et al. | 501/88 |
| 2005/0150866 A1* | 7/2005 | O'Donnell et al. | 216/67 |

FOREIGN PATENT DOCUMENTS

| | | |
|---|---|---|
| EP | 0 555 546 A1 | 8/1993 |
| EP | 0604 096 B1 | 6/1994 |
| EP | 0 607 651 A1 | 7/1994 |
| EP | 1 158 072 A2 | 11/2001 |
| EP | 1 239 055 A2 | 9/2002 |
| EP | 1 245 696 A2 | 10/2002 |
| JP | 9-235685 | 9/1997 |
| JP | 9-295863 | 11/1997 |
| JP | 10-4083 | 1/1998 |
| JP | 10-45461 | 2/1998 |
| JP | 10-45467 | 2/1998 |
| JP | 10045461 A | 2/1998 |
| JP | 10-67554 | 3/1998 |
| JP | 10-236871 | 9/1998 |
| JP | 10-330150 | 12/1998 |
| JP | 11-102900 | 4/1999 |
| JP | 11-157916 | 6/1999 |
| JP | 11-214194 | 8/1999 |
| JP | 11-251093 | 9/1999 |
| JP | 11-278944 | 10/1999 |
| JP | 11-279761 | 10/1999 |
| JP | 2000-1362 | 1/2000 |
| JP | 2000-103689 | 4/2000 |
| JP | 2001-031484 | 2/2001 |
| JP | 2005279439 A * | 10/2005 |
| WO | WO 02/056420 A2 | 7/2002 |

OTHER PUBLICATIONS

Wolf, Stanley. "Dry Etching for VLSI Fabrication", Silicon Processing for the VLSI ERA, vol. I: Process Technology, Lattice Press, California, 1986, pp. 542-547.

Weast, Robert C. "Physical Constants of Inorganic Compounds", CRC Handbook of Chemistry and Physics, 60th Ed., CRC Press, Inc., 1979, p. B-81.

* cited by examiner

SEMICONDUCTOR PROCESSING COMPONENTS AND SEMICONDUCTOR PROCESSING UTILIZING SAME

CROSS-REFERENCE TO RELATED APPLICATION(S)

This application claims priority to both U.S. Provisional Application 60/603,984, filed Aug. 24, 2004 and U.S. Provisional Application 60/603,985, filed Aug. 24, 2004, the subject matter of both applications thereof being incorporated herein by reference in their entirety.

BACKGROUND

1. Field of the Invention

The present invention is generally directed to semiconductor processing components, and processing techniques utilizing such components.

2. Description of the Related Art

In modern semiconductor processing, semiconductor wafers are processed through various stations or tools. Processing operations include, for example, high temperature processing such as diffusion, oxidation, ion implant, annealing, and deposition. In each process station or tool, great care is generally taken to minimize contamination of the semiconductor wafers with particles and/or foreign or unwanted species. The demand for ever increasing and more stringent clean standards is driven by numerous factors in the industry, including migration to even finer device sizes and circuit density per semiconductor die. Further, the price per semiconductor wafer continues to increase exponentially, as the sizes of semiconductor wafers continually increase. In this regard, currently the industry is transitioning to 300 mm from 200 mm wafers and the cost associated with such wafers has jumped considerably.

In light of the cost of semiconductor processing, the cost of raw materials including semiconductor wafers, and the electrical density associated with current and next generation semiconductor devices, there is an intense driving force to reduce contamination during processing. Once source of contamination is generally well understood and relates to particles generated in various deposition processes, including high temperature deposition. More particularly, thin films such as polysilicon, silicon nitride, and deposited silicon dioxide, are oftentimes deposited via chemical vapor deposition (CVD) processing, particularly including batch processing utilizing horizontal and vertical furnaces. Conventionally, quartz has been utilized for the material of choice for various components of such process tools, including wafer holders (horizontal wafer boats and vertical racks), baffles, internal liners, and process tubes. However, due to differences in thermal expansion between these quartz semiconductor processing components and the materials that are deposited, film stresses tend to develop during repeated heating and cooling cycles. These stresses increase in concert with an increase in thickness of the deposited material. Accordingly, after numerous processing cycles, a critical thickness is reached, the film stress exceeds the modulus of rupture of the deposited film, and cracks develop. The cracked film then typically delaminates from the semiconductor processing components, forming particles within the processing tool that contaminate processing and reduce die yield.

In light of the foregoing, it has been essential to take the tool offline and execute a clean after a specified number of processing cycles. Given the cost of semiconductor processing, tool downtime is very expensive, and re-qualification and recalibration procedures for getting the tool back online are oftentimes exacting and difficult to meet.

Current generation technology has focused on use of alternative materials to minimize the difference in thermal expansion coefficients between the semiconductor processing components and the deposited films, and accordingly reduce tool downtime and extend cleaning intervals. In this regard, introduction and widespread use of silicon carbide-based semiconductor processing components has been successful, due largely to the better match in thermal expansion coefficients between these new generation processing components and the deposited films. Indeed, as compressive stresses in the deposited films have been attenuated by to such an extent that the maximum or critical thickness of the deposited film has increased by at least an order of magnitude. As such, significantly more process cycles may be repeated at a single tool prior to cleaning.

In addition to batch processing, semiconductor fabrication generally implements a series of single-wafer processes, oftentimes utilizing halogen plasmas for a variety of reasons such as etching. Halogen plasma application is a preferred method of etching metal and dielectric layers due to anisotropic etch characteristics. Due in part to widespread use of such aggressive plasmas in single-wafer processing, typically components are formed of anodized Al or aluminum oxide ceramics. However, the art has recognized generation of unacceptably high levels of Al metal, and $AlF_3$ and $AlCl_3$ particle contamination, originating from use of Al-containing compositions.

While introduction of silicon carbide-based semiconductor batch processing components has proven to be largely successful, a need continues to exist in the art for processing techniques and semiconductor processing components that even further reduce or enable reduction in contaminant levels and provide further improved semiconductor die yield. In addition, despite widespread use of anodized Al and aluminum oxide ceramics in single-wafer processing to withstand aggressive plasmas, a need continues to exist in the art for improved components, particularly components with attenuated metal and particle contamination.

SUMMARY

According to one aspect of the present invention, a semiconductor processing component is provided, which includes a substrate and a particular layer overlying the substrate. The layer has the composition $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$.

According to another aspect of the present invention, a method for processing at least one semiconductor wafer is provided, which includes loading at least one semiconductor wafer into a deposition apparatus that includes a semiconductor processing component, processing the semiconductor wafer by depositing material on the wafer, and cleaning the semiconductor processing component inside the deposition apparatus. Cleaning is generally carried out by exposure to a reactive gas to remove deposited species from the semiconductor processing component. The semiconductor processing component has an outer surface comprising a composition selected from the group of (i) a rare earth oxide, and (ii) $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$.

According to another embodiment, a batch processing component, such as a wafer boat for supporting a plurality of semiconductor wafers, comprises a substrate and a layer overlying the substrate, the layer comprising a composition from the group consisting of (i) a rare earth oxide, and (ii) $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$.

BRIEF DESCRIPTION OF THE DRAWINGS

The present disclosure may be better understood, and its numerous features and advantages made apparent to those skilled in the art by referencing the accompanying drawings.

FIG. 5 illustrates a cross-sectional view of a portion of the wafer boat or carrier of FIG. 1.

The use of the same reference symbols in different drawings indicates similar or identical items.

DETAILED DESCRIPTION

According to one aspect of the present invention, a semiconductor processing component is provided, which includes a substrate and a layer overlying the substrate. The processing component may be chosen from one of various geometric configurations for various processing operations, and may be configured for receiving various sized wafers, whether 150 mm, 200 mm, or newer generation 300 mm wafers, for example. Processing components may be roughly divided into two categories, batch processing components in which multiple wafers are simultaneously processed, and single-wafer processing components. Batch processing is oftentimes used in connection with high temperature treatments, such as diffusion, deposition, annealing, oxidation, etc. Single-wafer processing is typically utilized in connection with lithography and etch, for example.

Batch processing components include, for example, wafer holders including horizontal wafer boats and vertical racks, process tubes, process tube liners (e.g., furnace liners), process chambers, pedestals, injectors, baffles, dummy wafers, shields, pins, wafer paddles, and cantilever rods. Of the foregoing, particular semiconductor processing components of interest include wafer holders, process chambers and process or furnace liners. Single-wafer processing components include, for example, wafer holders, focus rings, suspension rings, susceptors, injectors, gas distributors, shower heads, and chamber liners.

Figure 1:
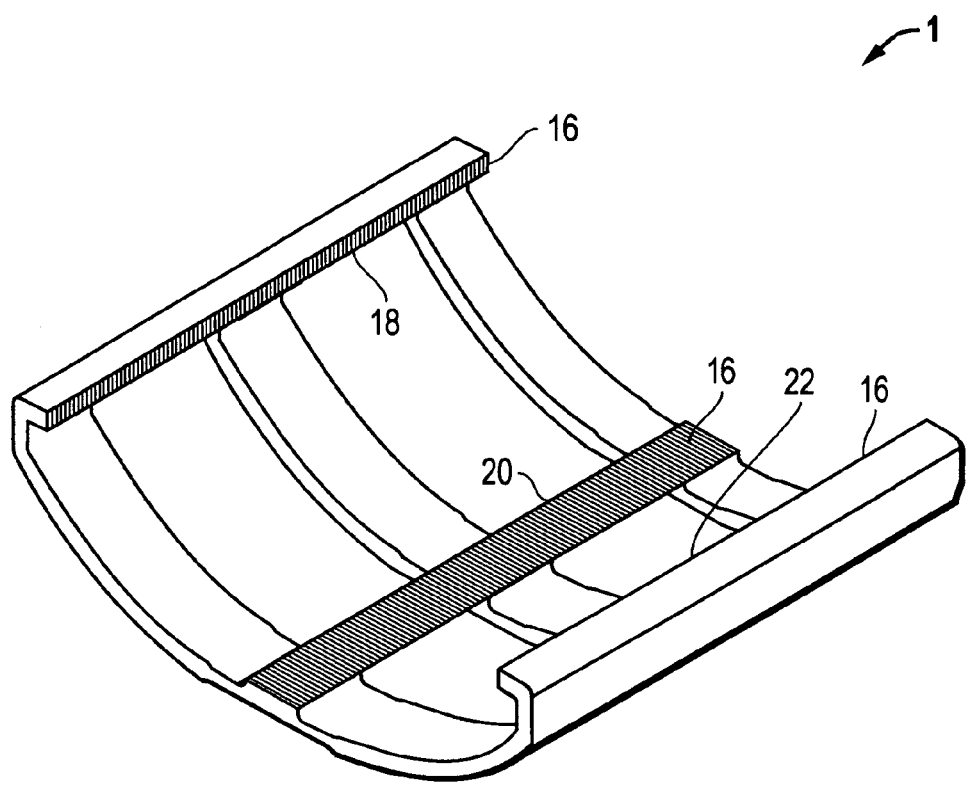
FIGS. 1 and 5 illustrate an embodiment of the present invention, namely a wafer boat or carrier.

One example of a batch semiconductor processing component is shown in FIG. 1, in the form of wafer boat 1. The wafer boat is provided having a plurality of grooves 16, each of which extends along the same radius of curvature and receives a respective semiconductor wafer. Each groove has an individual groove segment 18, 20 and 22, which may machined following fabrication of the wafer boat proper. The wafer boat may be fabricated according to one of the techniques described below, such as by impregnating a silicon carbide core with molten elemental silicon, then executing CVD to form a deposited silicon carbide layer. While FIG. 1 illustrates a horizontal wafer boat, it is to be understood that vertical wafer boats or wafer carriers may be utilized as well, as well as other semiconductor processing components as already mentioned.

Figure 5:
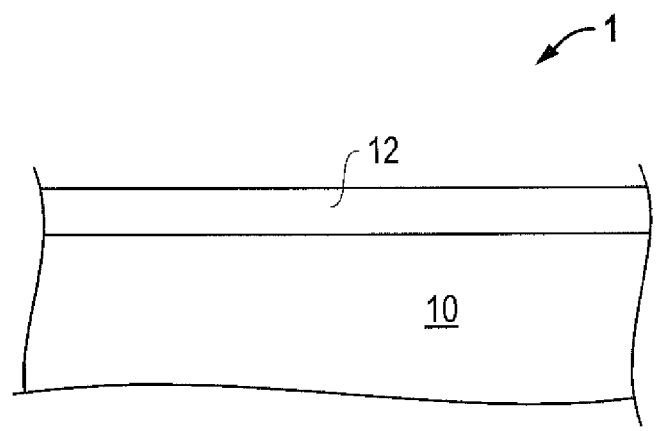

Typically, the substrate 50 of the processing components is the main structural feature providing mechanical support and integrity, as shown in FIG. 5. Any one of several materials may be utilized to form the substrate 50 according to embodiments of the present invention. In one embodiment, Si-containing compositions are utilized. For example, silicon dioxide, such as in the form of quartz, may form the substrate 50. In this regard, quartz processing components, such as quartz wafer boats, have been used in the art and fabrication techniques for forming same are generally well known.

In addition to quartz, another Si-containing composition includes silicon carbide-based processing components. Such processing components may be formed by provision of a silicon carbide substrate formed, for example, by slip casting and subsequent firing. Oftentimes, the silicon carbide substrate is then impregnated with molten elemental silicon, forming a Si—SiC composite substrate. In this case, the silicon carbide member functions as a core, for impregnation with molten silicon, the core providing mechanical support of the component. Optionally, the impregnated silicon carbide component may be coated with a high purity layer, such as silicon carbide, by chemical vapor deposition (CVD). The deposited layer may advantageously prevent auto-doping of the underlying silicon, as well as prevent migration of impurities from the bulk of the substrate to an outer surface of the component which may lead to contamination during semiconductor wafer processing. As noted above, while slip casting may advantageously be used to form such silicon carbide-based processing components, alternative techniques such as pressing may be utilized. Other specialized techniques may also be used, such as by using a conversion process in which a carbon preform is converted to silicon carbide.

In the context of silicon carbide-based processing components, the substrate 50 may also be formed of stand-alone silicon carbide formed of one of various processes such as CVD of silicon carbide. This particular processing technique enables formation of a processing component that is of relatively high purity, but the geometry of such components may be somewhat limited.

According to another embodiment, the substrate may be formed of a carbonaceous material, particularly graphite. Here, graphite is generally formed by pressing techniques, such as by isopressing followed by machining. Use of graphite-based processing components carries several advantages including low reactivity in processing environments, as well as ease of fabrication, particularly including ease of final stage machining.

While the foregoing has focused Si-containing and carbonaceous substrates, which may be particularly suitable in the context of batch processing components, other substrate materials may be utilized. For example, particularly in the context of single wafer processing components, Al-containing compositions may be utilized, such as Al metal or metal alloy, anodized Al metal or metal alloy (thereby having an aluminum oxide coating), aluminum nitride-based ceramic bodies, and alumina-based ceramic bodies. In the context of alumina-based ceramic bodies, typically the substrate is formed principally of alumina. Likewise, aluminum nitride based ceramic bodies are typically formed principally of aluminum nitride ceramic. In addition, the anodized Al-metal or Al-alloy and the alumina-based ceramic embodiments typically have a substrate outer surface (over which the layer extends) that is composed of alumina.

Following provision of a suitable substrate forming the main structural backbone of the semiconductor processing component, the substrate is typically processed to form or deposit a layer overlying the substrate. According to an embodiment, one function of the layer is to improve etch resistance of the processing component. More particularly, the layer provides chemical robustness to the processing component in relatively reactive and hostile cleaning environments, thereby enabling cleaning of the processing component in situ in the semiconductor processing tool, notably including deposition furnaces (discussed in more detail below). Here, turning to the composition of the layer, a particular rare earth silicate/germanate is utilized. More particularly, the composition is $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$. Typically y is less than 1, such as less than about 0.985 or 0.975. Restriction on the value of y may attenuate presence of Si(Ge)oxide within grain boundaries of the material, which may disadvantageously impact etch resistance. According to certain embodiments, y is greater than about 0.5, such as greater than about 0.75. FIG. 5 includes a cross-sectional view of a portion of the wafer boat or carrier 1 including a substrate 10 and a layer 12, wherein the layer 12 overlies the substrate 10, and the substrate 10 and layer 12 have compositions as described herein.

In the $Re-Si_{1-a}Ge_a-O$ system (Re-A-O system), generally two compounds are stable at room temperature, $Re_2O_3 \cdot AO_2$, and $Re_2O_3 \cdot 2AO_2$. Note that these two compounds may be also expressed as $Re_2AO_5$ and $Re_2A_2O_7$, respectively, as well as $ReA_{0.5}O_{2.5}$ and $ReAO_{3.5}$, respectively. The foregoing formula provided above generally indicates a blend of components $Re_2O_3 \cdot AO_2$, $Re_2O_3 \cdot 2AO_2$, and $Re_2O_3$ up to 100% $Re_2O_3 \cdot 2AO_2$ (corresponding to y=1).

According to specific embodiments, Y, La, Nd, Gd, Pr, and combinations thereof may generally be utilized. In one embodiment, Re is formed of Y, La, or combinations thereof, and in a certain embodiment, Re is entirely Y. Also, while the composition may be a silicate, germanate, or a silicate/germanate blend, a may be zero, such that the composition is entirely silicate-based. This particular embodiment may be advantageous for certain applications in which the semiconductor processing environment is sensitive to germanium-containing compounds, relative to silicon-containing compounds. According to another particular embodiment, a is zero, Re is Y and the composition mainly comprises the di-silicate form yttria silicate, $Y_2Si_2O_7$ ($YSiO_{3.5}$). Here, while the main or majority phase of the layer is the di-silicate composition, the composition may include the monosilicate form of yttrium silicate, as well, $Y_2SiO_5$ ($YSi_{0.5}O_{2.5}$).

Independent of the particular compositional makeup of the rare earth silicate/germanate composition, the layer may be applied by any one of several methods, including plasma spraying, chemical vapor deposition (CVD), including plasma enhanced CVD and low pressure CVD, sputtering, sol-gel or dip coating. Given the density and relative purity of the resulting coating, CVD may be advantageously utilized to form the precise target stoichiometry and target purity level of the layer. Generally, the layer has a thickness within a range of about 10 μm to about 500 μm. In certain embodiments, the thickness is limited to maintain precise dimensional control of the outer contour of the component, for example. In such an embodiment, the thickness may be limited to not more than 300 μm. Indeed, certain embodiments have layer thicknesses within a range of about 50 to 300 μm, such as about 50 to 200 μm.

Surface preparation for the overlying coating includes oxidation of the substrate to improve adhesion, as well as surface roughening techniques (grit blasting, chemical etching). Post coat annealing may be carried out to improve adhesion and/or appearance (e.g., oxidation to provide a white color).

In the particular case of quartz-based substrates, a graded compositional surface layer may be implemented. More particularly, the CTE-matching graded interfacial region may be provided between the layer and the substrate. Advantageously, the interfacial region is an A-rich region, and may be formed by reaction. For example, a reactive species containing Re may be reacted at high temperature (e.g., above 300° C.) to form a the A-rich region, preferably gradually increasing in Re content through a thickness direction extending away from the substrate. Subsequent to completion of the graded interfacial region, the rare earth silicate/germanate layer is deposited. In this way, thermal stresses in the rare earth silicate/germanate layer may be attenuated.

Typically, the rare earth silicate/germanate layer defines an outer surface of the component, this outer surface being directly subjected to processing environments during semiconductor die fabrication. The actual contour of this outer layer may vary widely depending upon the geometry of the processing component, generally selected from the list of processing components already provided above.

Advantageously the rare earth silicate/germanate layer has a thermal expansion coefficient at room temperature that is relatively close to that of the underlying substrate. Particularly, the difference in thermal expansion coefficients between the substrate and the layer is most typically not more than 30%, such as not more than 20%, or even 10%.

Figure 6:
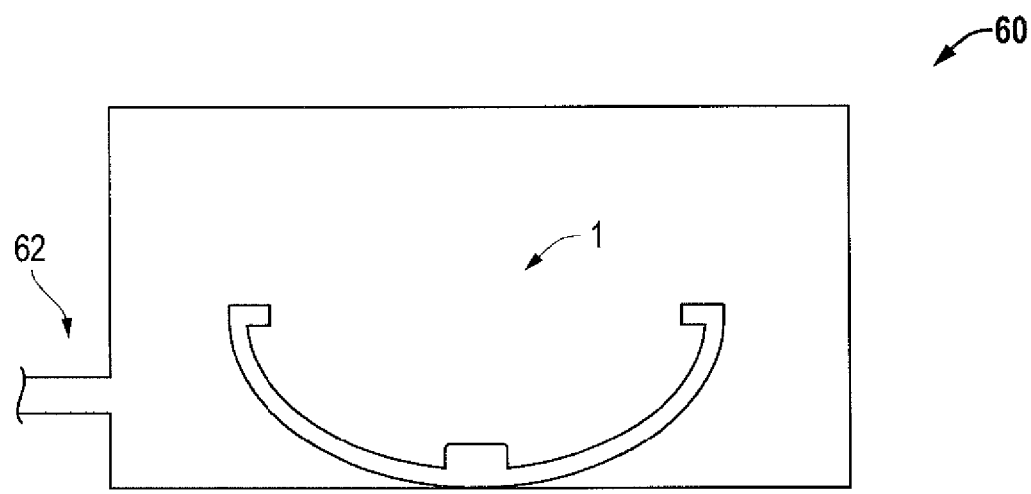
FIG. 6 illustrates a schematic depiction of an apparatus having a wafer boat or carrier and a halogen gas inlet.

The resulting composite structure containing the above-described substrate and rare earth silicate/germanate coating generally has improved resistance to aggressive cleaning environments as compared to state-of-the-art processing components, such as those formed of silica or silicon carbide. This particular feature may be important for current and next generation processing parameters for cutting edge semiconductor fabrication. More particularly, by providing semiconductor processing components that are resistant to reaction with cleaning environments such as highly reactive halogen environments that contain radicals and/or monoatomic and diatomic halogens such as F, or Cl, the processing components may be cleaned in situ. FIG. 6 illustrates a schematic depiction of an apparatus 60, such as a deposition apparatus, having the wafer boat or carrier 1 and a halogen gas inlet 62 to introduce a halogen-containing gas into the apparatus 60. By cleaning the processing component in situ, typically in the deposition apparatus, the processing component may be cleaned more frequently without the need for completely taking the tool offline. Online removal of deposited species through use of an in situ cleaning gas, such as a gaseous environment typically utilized in etching chambers, enables near 100% up-time. Frequent cleanings also attenuate the need for processing components that have closely matched thermal expansion coefficients with those of the deposited species due to reduction in layer thickness between cleans. Still further, frequent cleans help ensure a consistent, predictable environment for processing operations such as deposition, which is of great assistance to process engineers in developing a repeatable process flow whereby wafer-to-wafer and lot-to-lot environmental variations are minimized.

As should be clear from the foregoing, utilization of the rare earth silicate/germanate compositional layer improves robustness of the semiconductor processing component. This improvement may be quantified in terms of etch ratio herein defined as the rate at which the component etches (loses material weight) in a reactive halogen etch gas environment relative to the rate at which chemical vapor deposited (CVD)

SiC is etched in the same halogen etch gas environment. Embodiments of the present invention have an etch ratio not greater than about 0.5. Other embodiments provide even improved performance, such as an etch ratio not greater than about 0.1, such as not greater than about 0.05.

According to yet another embodiment of the present invention, a method of processing at least one semiconductor wafer is provided. The method generally begins with loading at least one semiconductor wafer (multiple semiconductor wafers in the context of batch processing) into a deposition apparatus that includes a semiconductor processing component as described above with respect to the first embodiment. The semiconductor wafer is then processed by depositing material thereon. Numerous loading/processing cycles may be carried out before continuing with the processing method. Following at least one loading/processing cycle, most typically multiple cycles, the semiconductor processing component is cleaned inside the deposition apparatus by exposure to a reactive gas to remove deposited species from the processing component. The reactive gas may be in the form of a plasma that includes charged radicals, such as in the case of typical halogen etch environments. Alternatively, the reactive gas may contain substantially neutral species such as a reactive gas produced by a downstream plasma. In either case, whether utilizing a reactive gas in the form of a plasma or a neutral gas, most often the reactive gas contains a halogen reactive species, such as fluorine or chlorine. Fluorine is oftentimes utilized in semiconductor processing in etch environments and is a suitable choice, as it has already been widely qualified in semiconductor processing fabs. While monoatomic fluorine provides superior reaction kinetics, diatomic fluorine may also be present in the clean environment, that is, the post-deposition cleaning environment.

According to one feature, processing of the semiconductor wafer is typically carried out at an elevated temperature such as at a temperature of at least 300° C. As such, the deposition apparatus is sometimes referred to as a furnace, having heating capability. The deposited species may be any one of known species utilized for semiconductor fabrication, including silicon dioxide, silicon, silicon nitride ($SiN_x$), and any interlayer dielectrics. In the case of silicon dioxide, the silicon dioxide may be in the form of a glass doped with fluorine, boron, or phosphorus, or in the form of polycrystalline silicon dioxide. Silicon may be in the form of polysilicon or epi-silicon, and silicon nitride may be in stoichiometric ($Si_3N_4$) as well as non-stoichiometric forms.

According to one particular feature, since the semiconductor processing component is cleaned in situ, within the deposition chamber, the processing component may be cleaned often without largely imparting significant downtime. As such, typically the thickness of the deposited material that is cleaned is comparatively low relative to the state of the art. For example, the deposited species may have a thickness not greater than about 50 microns, such as not greater than about 25 microns or even not greater than 10 or 5 microns. These relatively thin layers are typically the result of only limited loading and processing cycles prior to cleaning. For example, the loading and processing cycles may be limited to no more than 50, such as not more than 25 or even not more than 10 cycles.

The actual configuration of the deposition apparatus may vary widely depending upon the particular toolset being utilized. The deposition apparatus may be a CVD apparatus a PVD apparatus, plasma spraying apparatus or sol-gel coating apparatus. However, typically the apparatus is a CVD apparatus, such as a low pressure CVD apparatus or plasma enhanced CVD apparatus.

EXAMPLES

Figure 2:
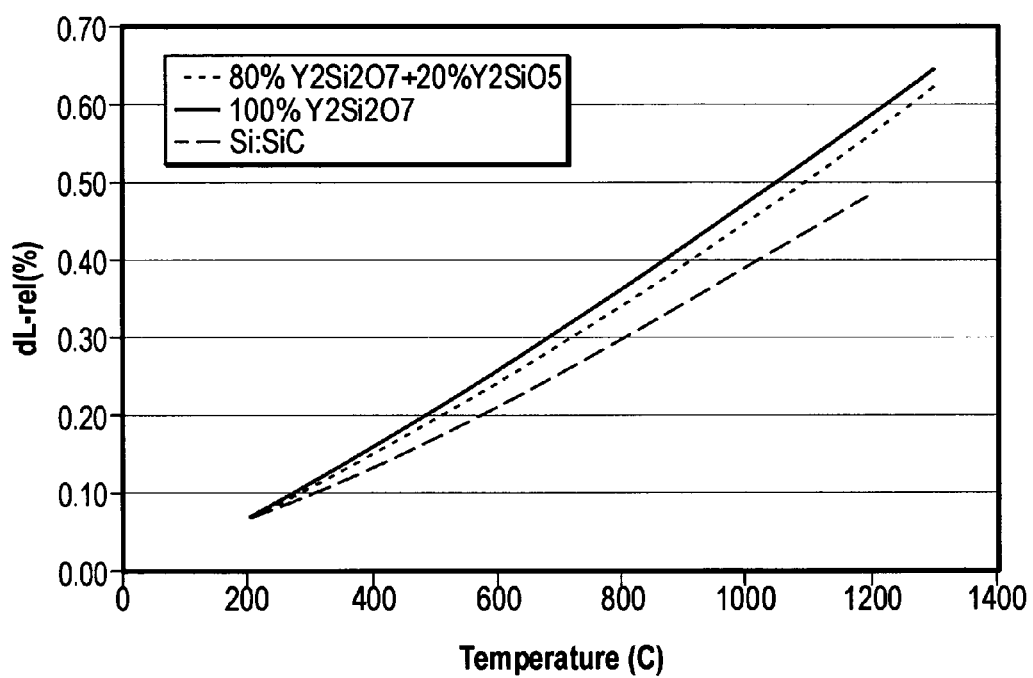
FIG. 2 compares thermal expansion behavior of siliconized SiC (Si—SiC), $Y_2Si_2O_7$, and 80% $Y_2Si_2O_7$+20% $Y_2Si_2O_5$ materials.

Coating compositions according to various examples are based on yttrium silicates (Y—Si—O system), particularly two basic mixed metal compositions between $SiO_2$ and $Y_2O_3$: $Y_2Si_2O_7$ and $Y_2SiO_5$. The two phases cover a wide thermal expansion coefficient range from 4 ppm/K for $Y_2Si_2O_7$ to 7 ppm/K for $Y_2SiO_5$. The yttrium silicate compounds and blends can be used to protect materials with a wide CTE range, such as from alumina (CTE of ~8 ppm/K) to SiC (CTE ~4.5 ppm/K). For example, CTE of Si:SiC can be matched by a 80:20 $Y_2Si_2O_7$:$Y_2SiO_5$ combination as shown in FIG. 2, while the CTE of alumina can be matched by $Y_2O_3$ or $Y_2O_3$+$Y_2SiO_5$ compositions. In addition to Y—Si—O system, rare earth metals such as La, Nd, Gd or Pr can also be used instead of Y due to the relative stability of their respective metal halides.

Plasma etch tests for Y—Si—O compositions were conducted under two different conditions, fluorine and chlorine plasma tests.

Figure 3:
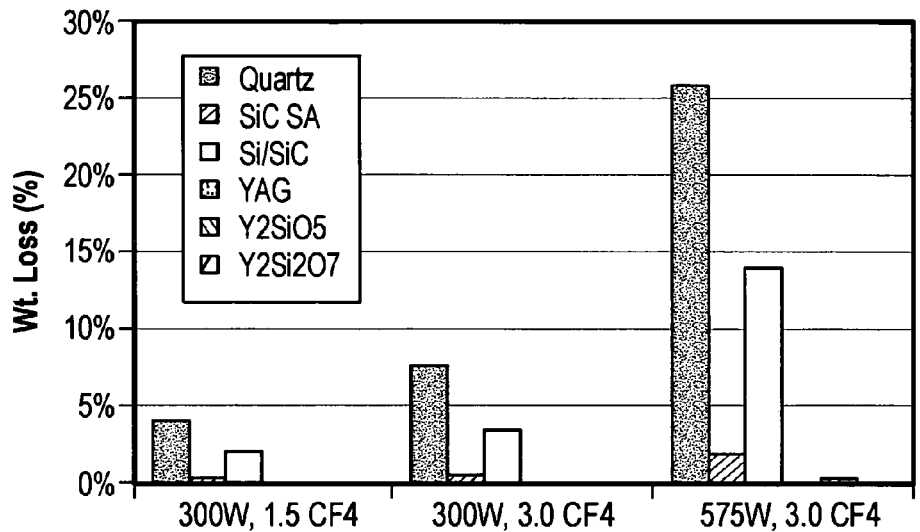
FIG. 3 compares etch rates of fused quartz, standalone SiC, Si:SiC, YAG and yttrium silicates in fluorine plasma.

FIG. 3 compares etch rates of various materials under 3 different conditions, namely (i) 300 W, RF plasma, $CF_4$+$O_2$ 1.5 sccm, 270 mbar (chamber temperature ~175 C), (ii) 300 W, RF plasma, $CF_4$+$O_2$ 3.0 sccm, 380 mbar (chamber temperature ~190 C), and (iii) 575 W, RF plasma, $CF_4$+$O_2$ 3.0 sccm, 420 mbar (chamber temperature ~230 C). All testing was carried out with zero bias, duration of 10.5 hours. No etch rate or weight change could be measured for any of the yttrium silicate compositions as compared to significant etching of the fused quartz, Si:SiC and CVD-SiC.

Figure 4:
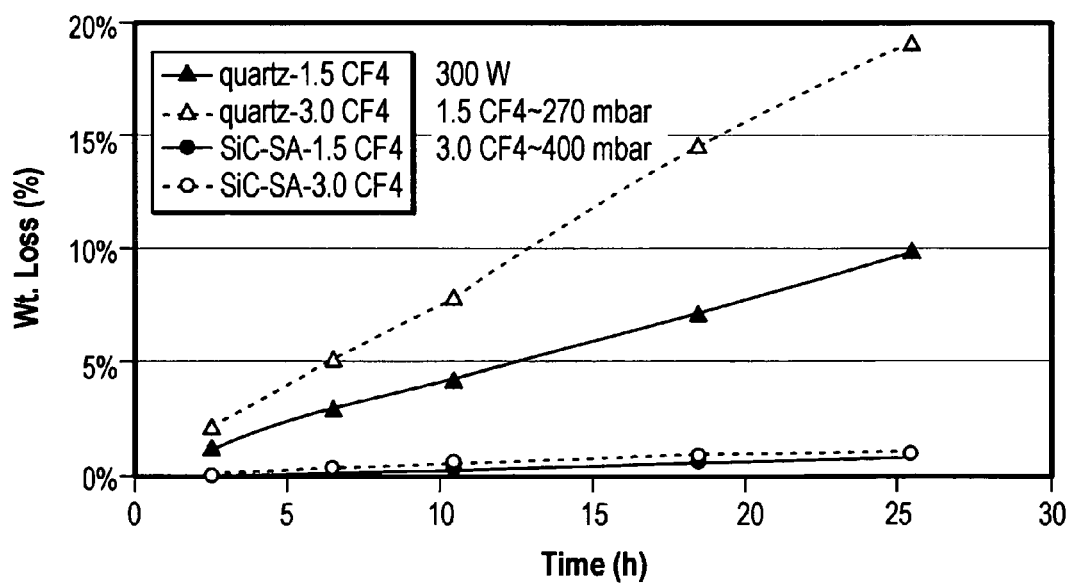
FIG. 4 compares etch rates of fused quartz, standalone, SiC at 300 W $Cf_4+O_2$ at two different flow rates: 1.5 sccm and 3.0 sccm.

FIG. 4 compares etch rates of fused quartz and standalone SiC at 300 W $CF_4$+$O_2$ at two different flow rates of 1.5 sccm and 3.0 sccm, as a function of time. Overall yttrium silicate compositions did not show any weight change or significant etching even after 50 h of etching at 300 W in $CF_4$ based fluorine plasma, while quartz showed 37% weight loss, Si:SiC 25% weight loss and CVD-SiC 1.5% weight loss.

Further testing was done to compare chlorine plasma etch resistance, under the following conditions: power 80 W (150 fwd, 70 return), 250 mTorr pressure, flows of Ar (3.4 sccm), $Cl_2$ (24 psig, 1.2 sccm) and $BCl_3$ (20 C supply, 1.4 sccm), bias of 490 V, duration 7 hrs, 46 min. The yttrium silicate compositions were found to have significantly reduced etch rates compared to $Al_2O_3$ and SiC as shown below in Table 1:

TABLE 1

| Sample | Etch Rate (μm/hr) |
| --- | --- |
| YAG | 1.6 |
| $Y_2Si_2O_7$ | 1.7 |
| 80 $Y_2Si_2O_7$/20 $Y_2SiO_5$ | 1.0 |
| SiC | 16 |
| $Al_2O_3$ | 6.5 |

Another round of testing was done to compare chlorine plasma etch resistance at a lower bias level, under the following conditions: power 58 W (99 fwd, 42 return), 250 mTorr pressure, flows of Ar (3.4 sccm), $Cl_2$ (24 psig, 1.2 sccm) and $BCl_3$ (20 C supply, 1.4 sccm), bias of 350 V, duration 7 hrs, 8 min. The yttrium silicate compositions were found to have significantly reduced etch rates compared to $Al_2O_3$ and $SiO_2$ as shown below in Table 2:

TABLE 2

| Sample | Etch Rate (μm/hr) |
|---|---|
| YAG | <0.2 |
| $Y_2Si_2O_7$ | <0.2 |
| 80 $Y_2Si_2O_7$/20 $Y_2SiO_5$ | <0.2 |
| $Y_2SiO_5$ | <0.2 |
| Y metal | <0.2 |
| $Y_2O_3$ | <0.2 |
| $SiO_2$ | 8.2 |
| $Al_2O_3$ | 3.4 |

While embodiments described above have focused on rare earth silicate/germanate compositions, another aspect is directed to rare earth oxide compositions, (substantially free of Si and Ge), which replace the rare earth silicate/germanate composition forming the outer layer. Of the rare earth oxides, simple oxides may be used, in which a rare earth element or elements are in oxide form, free of non-rare earth cations. Lanthanum oxide, e.g., $La_2O_3$, and yttrium oxide, e.g., $Y_2O_3$, are of particular interest, given their robustness and chemical stability in hostile and aggressive clean environments (discussed in more detail below). Certain embodiments take advantage of yttrium oxide preferentially over lanthanum oxide.

Further, while particular substrate/layer combinations have been described herein, the entire structure of the component may be formed of the layer composition, that is, monolithic components may be formed of the rare earth silicate/germanate according to one embodiment or of a rare earth oxide according to another embodiment. Whether monolithic or a substrate/layer structure, the composition herein is that which forms the outer surface of the component, which surface is exposed deposition and cleaning operations as discussed above.

The above-disclosed subject matter is to be construed as illustrative and not restrictive, and the appended claims are intended to cover all such modification, enhancements, and other embodiments that fall within the scope of the present invention. Thus, to the maximum extent allowed by law, the scope of the present invention is to be determined by the broadest permissible interpretation of the following claims and their equivalence and shall not be restricted or limited by the foregoing detailed description.

What is claimed is:

1. A semiconductor processing component, comprising:
    a substrate comprising SiC; and
    a layer overlying the substrate, the layer comprising a composition $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$,
    wherein the semiconductor processing component includes the substrate and layer and is a batch or single wafer processing component.

2. The semiconductor processing component of claim 1, wherein y is less than 1.

3. The semiconductor processing component of claim 2, wherein y is greater than about 0.5.

4. The semiconductor processing component of claim 3, wherein y is greater than about 0.75.

5. The semiconductor processing component of claim 1, wherein a is less than 1.

6. The semiconductor processing component of claim 1, wherein Re is Y, La, Nd, Gd, Pr, or combinations thereof.

7. The semiconductor processing component of claim 6, wherein Re is Y.

8. The semiconductor processing component of claim 1, wherein the a=0.

9. The semiconductor processing component of claim 1, wherein the a=0, Re is Y, the composition comprising mainly $YSiO_{3.5}$.

10. The semiconductor processing component of claim 9, wherein the composition further includes $YSi_{0.5}O_{2.5}$.

11. The semiconductor processing component of claim 1, wherein the layer has a thermal expansion coefficient at room temperature not more than 30% different from the substrate.

12. The semiconductor processing component of claim 11, wherein the difference is not more than 20%.

13. The semiconductor processing component of claim 1, wherein the batch processing component is capable of being utilized in a processing tool for treating multiple semiconductor wafers simultaneously.

14. The semiconductor processing component of claim 1, wherein the single wafer processing component is capable of being utilized in a processing tool for treating a single semiconductor wafer at a time.

15. A deposition apparatus comprising:
    the semiconductor processing component of claim 1; and
    a halogen gas inlet.

16. A method of processing at least one semiconductor wafer, comprising:
    loading at least one semiconductor wafer into a deposition apparatus, the deposition apparatus including a semiconductor processing component, the semiconductor processing component having an outer surface comprising a composition of $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1.0$;
    processing the semiconductor wafer by depositing material on the wafer; and
    cleaning the semiconductor processing component inside the deposition apparatus by exposure to a halogen-containing gas to remove deposited species from the processing component.

17. A wafer boat for supporting a plurality of semiconductor wafers, comprising:
    a substrate comprising SiC; and
    a layer overlying the substrate, the layer comprising a composition of $ReA_yO_{1.5+2y}$, wherein Re is Y, La, a Lanthanoid series element, or a combination thereof, A is $(Si_{1-a}Ge_a)$, $0.25 \leq y \leq 1.2$, and $0 \leq a \leq 1$, wherein the wafer boat has a plurality of slots for supporting a plurality of semiconductor wafers.

* * * * *